(12) United States Patent
Kim

(10) Patent No.: US 7,812,350 B2
(45) Date of Patent: Oct. 12, 2010

(54) IMAGE SENSOR AND METHOD FOR MANUFACTURING THE SAME

(75) Inventor: Tae Gyu Kim, Eumsoeg-goon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 470 days.

(21) Appl. No.: 11/842,590

(22) Filed: Aug. 21, 2007

(65) Prior Publication Data

US 2008/0258248 A1  Oct. 23, 2008

(30) Foreign Application Priority Data

Apr. 17, 2007 (KR) .................. 10-2007-0037357

(51) Int. Cl.
*H01L 29/04* (2006.01)
(52) U.S. Cl. .................. 257/72; 257/E27.133
(58) Field of Classification Search .......... 257/59, 257/72, 292, 458, E27.133
See application file for complete search history.

(56) References Cited

U.S. PATENT DOCUMENTS

| 4,694,317 | A | 9/1987 | Higashi et al. |
| 6,759,262 | B2 | 7/2004 | Theil et al. |
| 6,809,358 | B2 * | 10/2004 | Hsieh et al. .................. 257/291 |
| 7,189,952 | B2 * | 3/2007 | Guedj et al. ............. 250/208.1 |
| 2004/0135209 | A1 | 7/2004 | Hsieh et al. |

\* cited by examiner

*Primary Examiner*—David Vu
(74) *Attorney, Agent, or Firm*—Saliwanchik, Lloyd & Saliwanchik

(57) ABSTRACT

An image sensor and a method for manufacturing the same are provided. A photodiode region and transistor region are vertically-integrated to improve the fill factor and resolution of the image sensor. Unit pixels can be isolated by a metal isolation layer arranged between adjacent photodiode areas.

9 Claims, 3 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0037357, filed Apr. 17, 2007, which is hereby incorporated by reference in its entirety.

BACKGROUND

In general, an image sensor is a semiconductor device for converting optical images into electrical signals, and is mainly classified as a charge coupled device (CCD) or a Complementary Metal Oxide Silicon (CMOS) image sensor.

A CMOS image sensor sequentially detects electrical signals of pixels in a switching scheme by forming photodiodes and MOS transistors in unit pixels.

A CMOS image sensor is simpler in a driving scheme than compared to a CCD image sensor. It is also capable of implementing a variety of scanning schemes and integrates signal processing in a single chip so that miniaturizing a product is possible. A CMOS image sensor uses CMOS technology so that manufacturing costs and power consumption are low.

A CMOS image sensor according to the related art has a substrate divided into a photodiode region for receiving a light signal to convert it into an electrical signal and a transistor region for processing the electrical signal.

A typical CMOS image sensor has a structure such that the photodiode and the transistor are horizontally arranged.

While the horizontal-type CMOS image sensor improves upon some of the disadvantages of the CCD image sensor, problems still exist in the horizontal-type image sensor.

According to the horizontal-type image sensor, the photodiode and the transistor are formed to be horizontally adjacent to each other on a substrate. Thus, the photodiode cannot encompass the entire area of a pixel region of the image sensor, leading to a reduced fill factor and/or limited resolution.

In addition, with a horizontal-type image sensor, it is very difficult to achieve optimization for the process of simultaneously manufacturing the photodiode and the transistor. A shallow junction is required for a low sheet resistance in a rapid transistor process, but the shallow junction may not be appropriate for the photodiode.

Furthermore, according to the horizontal-type CMOS image sensor, additional on-chip functions are added to the image sensor so that the sizes of unit pixels are increased or reduced in order to maintain the sensitivity of the image sensor.

When the size of the unit pixel is increased, the resolution of the horizontal-type CMOS image sensor is decreased. In addition, when the area of the photodiode is decreased, the sensitivity of the horizontal-type CMOS image sensor is decreased. Thus, there exists a need in the art for a CMOS image sensor and fabricating method with an improved fill factor.

BRIEF SUMMARY

Embodiments of the present invention provide an image sensor and a method for manufacturing the same by vertically integrating a transistor circuit and a photodiode.

The image sensor according to an embodiment of the subject invention includes a semiconductor substrate having a circuit region formed therein; a metal wiring layer formed on the semiconductor substrate including a plurality of metal wirings and an interlayer dielectric layer; optional lower electrodes formed on the metal wirings; first conductive layers formed to surround the lower electrodes; an intrinsic layer on the first conductive layers and the metal wiring layer; pixel isolation layers between the first conductive layers; and second conductive layers formed between the intrinsic layer and the pixel isolation layers.

In addition, a method for fabricating the image sensor according to an embodiment includes forming a metal wiring layer including a plurality of metal wirings and an interlayer dielectric layer on a semiconductor substrate having a circuit region formed therein; optionally forming lower electrodes on the metal wirings; forming first conductive layers on the lower electrodes; forming an intrinsic layer on the first conductive layers and having a via hole formed in the intrinsic layer on the metal wiring layer; forming second conductive layers on the sidewalls and the bottom surface of the via hole in the intrinsic layer; and forming pixel isolation layers in the inside of the via hole having the second conductive layers formed therein.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 8:
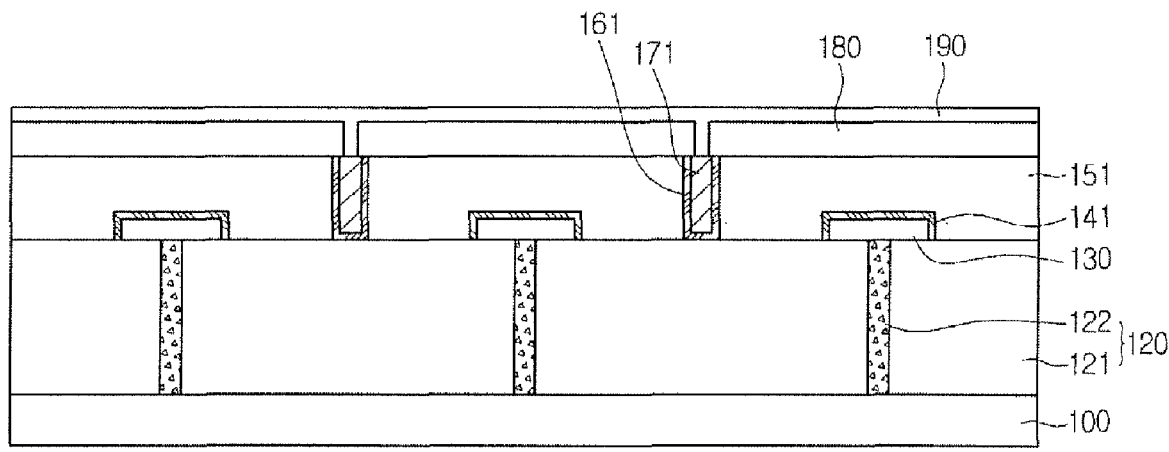

Referring to FIG. 8, the image sensor according to an embodiment of the present invention includes a semiconductor substrate 100 having a circuit region formed therein and a metal wiring layer 120, which includes a plurality of metal wirings 122 and an interlayer dielectric layer 121. Lower electrodes 130 may be formed on the metal wirings 122, with first conductive layers 141 formed to surround the lower electrodes 130. An intrinsic layer 151 can be formed on the metal wiring layer 120, and pixel isolation layers 171 are formed in the intrinsic layer 151.

Second conductive layers 161 can be formed between the intrinsic layer 151 and the pixel isolation layers 171 to provide a photodiode having a P-I-N structure.

The pixel isolation layer 171 can be formed of a metal material separating the photodiodes and metal wirings 122 into unit pixels.

Color filters 180 can be formed on the intrinsic layer 151 In an embodiment, the color filters 180 can be formed to expose at least a portion of the upper surfaces of the pixel isolation layers 171 by being spaced from neighboring color filters 180.

In certain embodiments, an upper electrode 190 can be formed on the semiconductor substrate 100, including the color filter 180, to provide a thin-type image sensor. In one embodiment, the color filters 180 can be formed above the upper electrode 190.

The image sensor of the present invention can provide a vertical-type integration of a transistor circuit and a photodiode.

In addition, the vertical-type integration of the transistor and the photodiode allows the fill factor to approach 100%.

Furthermore, the vertical-type integration makes it possible to achieve higher sensitivity in the same pixel size in an image sensor of the present invention than in the related art.

The unit pixels of an image sensor of the present invention can implement a complex circuit without reducing the sensitivity.

Moreover, the vertical-type photodiode is adapted to incorporate an insulating property between the unit pixels so that crosstalk between the pixels is inhibited, thereby making it possible to improve the reliability of the image sensor.

Figure 1:
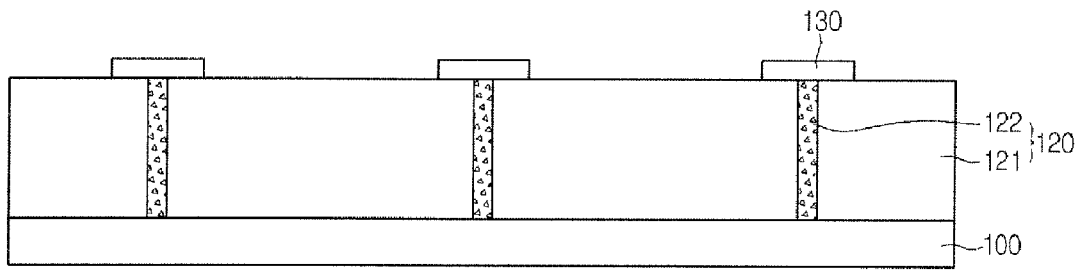
FIGS. 1 to 8 are cross-sectional views showing a process for manufacturing an image sensor according to an embodiment of the present invention.

Referring to FIG. 1, a metal wiring layer 120 including metal wirings 122 and an interlayer dielectric layer 121 can be formed on a semiconductor substrate 100 having a circuit region (not shown) formed therein.

Although not shown, the metal wiring layer 120 includes additional wirings in order to connect a power line or a signal line to the circuit region.

The metal wiring layer 120 is formed of an interlayer dielectric layer 121 and a plurality of metal wirings 122 formed in the interlayer dielectric layer 121.

In many embodiments, the interlayer dielectric layer 121 can be formed of an oxide film. The metal wirings 122 can be formed of a conductive material containing metal, alloy, or silicide. For example, the metal wiring 122 can be formed of aluminum, copper, cobalt, or tungsten.

In certain embodiments, a lower electrode 130 electrically connected to the metal wiring 122 can be formed on the metal wiring layer 120. The lower electrode 130 can be formed of a metal such as Cr, Ti, TiW, or Ta. In an alternative embodiment, no lower electrode 130 is formed.

Although not shown, a pad for external connections can be formed together when forming the lower electrode 130.

In many embodiments, a photodiode is formed on the metal wiring layer 120 and is electrically connected to the metal wiring 122.

The photodiode can be formed on the metal wiring layer 120 and receive light incident from the outside to convert and store it into an electrical form. Thus, the method and image sensor of the present invention utilize a P-I-N structure.

In many embodiments, the P-I-N diode is formed such that an n-type amorphous silicon, an intrinsic amorphous silicon, and a p-type amorphous silicon are bonded. The performance of the photodiode is decided depending on its efficiency in receiving light from the outside and converting it into an electrical form, and total charge capacitance. Typical existing photodiodes formed in a substrate generate and store charge at a depletion region generated in a hetero-junction such as P-N, N-P, N-P-N, or P-N-P. However, the P-I-N diode of embodiments of the present invention is a light diode that has an intrinsic amorphous silicon layer that is a pure semiconductor and is bonded between the p-type silicon layer and the n-type silicon layer. The P-I-N diode of embodiments of the present invention generates and stores charge since the entire intrinsic amorphous silicon layer formed between the p-type silicon layer and the n-type silicon layer becomes the depletion region.

In such embodiments, the P-I-N diode is used as the photodiode, and the structure of the P-I-N diode can be formed as P-I-N or N-I-P. For example, in an embodiment in which the P-I-N diode has the P-I-N structure, the n-type amorphous silicon is referred to as the first conductive layer 140, the intrinsic amorphous silicon is referred to as the intrinsic layer 150, and the p-type amorphous silicon is referred to as the second conductive layer 160.

Figure 2:
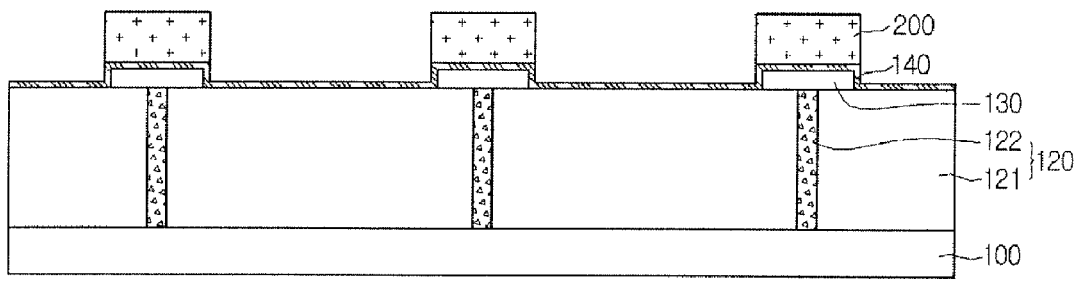

Referring to FIG. 2, a first conductive layer 140 can be formed on and around lower electrodes 130 formed on the metal wiring layer 120.

In an embodiment, the first conductive layer 140 can serve as the "N"-layer of the P-I-N diode.

In an embodiment, the first conductive layer 140 can be formed by using an n-doped amorphous silicon, but embodiments are not limited thereto.

The first conductive layer 140 can be formed of an amorphous silicon, for example, amorphous Si:H (a-Si:H), a-SiGe:H, a-SiC:H, a-SiN:H, or a-SiO:H by adding germanium, carbon, nitrogen, or oxygen to the amorphous silicon.

In an embodiment, the first conductive layer 140 can be formed by chemical vapor deposition (CVD), such as plasma enhanced chemical vapor deposition (PECVD). For example, the first conductive layer 140 can be formed of amorphous silicon by PECVD by mixing $PH_3$ or $P_2H_5$ with silane gas $SiH_4$.

A photoresist film can be applied on the first conductive layer 140 and patterned to form a first mask pattern 200. In one embodiment, the first mask pattern 200 is formed on at least the portion of the first conductive layer that covers each lower electrode 130.

Figure 3:
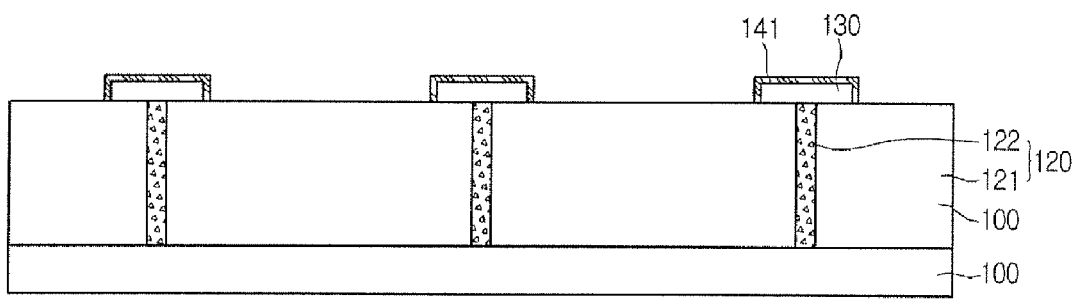

Referring to FIG. 3, in many embodiments, the first conductive layer 140 is etched by using the first mask pattern 200 as an etch mask. The first conductive layers 141 etched by the first mask pattern 200 are formed on the metal wiring layer 120 on the outer surfaces of the lower electrodes 130 and isolated from each other.

Figure 4:
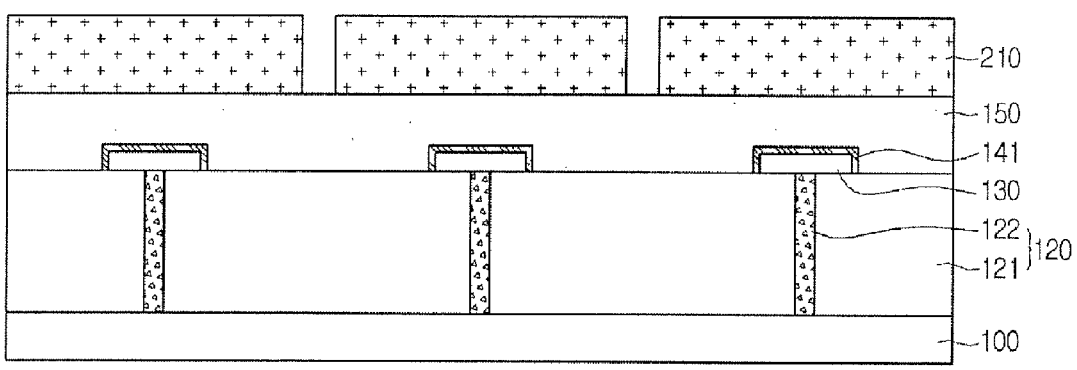

Referring to FIG. 4, an intrinsic layer 150 can be formed on the metal wiring layer 120 on which the first conductive layer 141 is formed. In an embodiment, the intrinsic layer 150 can serve as an "I"-layer.

The intrinsic layer 150 can be formed using an intrinsic amorphous silicon. In many embodiments, the intrinsic layer 150 can be formed by CVD, such as PECVD. For example, the intrinsic layer 150 can be formed of the amorphous silicon by PECVD using silane gas, $SiH_4$.

In many embodiments, the intrinsic layer 150 is about 10 to about 1000 times thicker than the first conductive layer 141. This is because the depletion region of the photodiode is increased proportional to the thickness of the intrinsic layer 150, leading to storage and generation of a large amount of light charge.

Next, a photoresist film is applied in order to isolate the photodiode and the metal wiring 122 by unit pixels. The photoresist film is patterned so that second mask patterns 210 are formed. In one embodiment, the second mask patterns 210 have openings. The opening of the second mask pattern 210 can be formed such that at least a portion of the upper surface of the intrinsic layer 150 corresponding to the region between the first conductive layers 141 is exposed.

Figure 5:
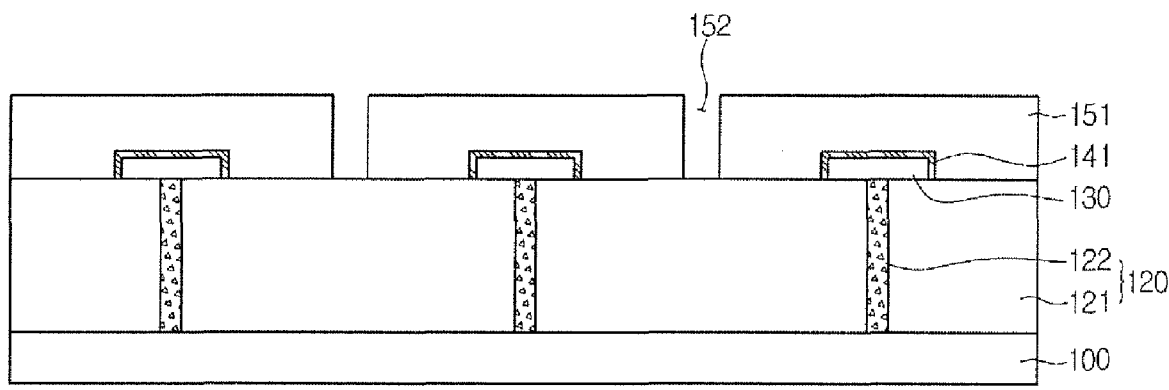

Referring to FIG. 5, the intrinsic layer 150 is etched using the second mask pattern 210 as the etch mask, forming a via hole 152 in the intrinsic layer 151. The via hole 152 in the intrinsic layer 151 is formed such that at least a portion of the upper surface of the interlayer dielectric layer 121 between the first conductive layers 141 is exposed. The intrinsic layers 151 are isolated from neighboring intrinsic layers 151 by the space of the via hole 152.

Accordingly, the metal wiring 122, the first conductive layer 141, and the intrinsic layer 150 become are isolated by unit pixels.

Figure 6:
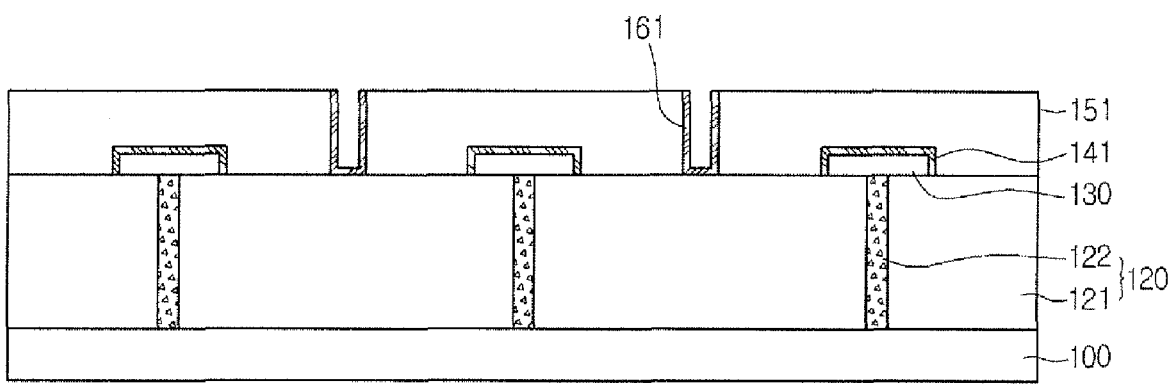

Referring to FIG. 6, a second conductive layer 161 is formed on a sidewall and a bottom of the via hole 152 in the intrinsic layer 151.

In one embodiment, the second conductive layer 161 can serve as the "P"-layer of the P-I-N diode.

In an embodiment, the second conductive layer 161 can be formed using a p-doped amorphous silicon, but embodiments are not limited thereto.

In one embodiment, the second conductive layer 161 can be formed by CVD, such as PECVD. For example, the second conductive layer 161 can be formed of amorphous silicon by PECVD by mixing $PH_3$ or $P_2H_6$ with silane gas, $SiH_4$.

In many embodiments, after forming the second conductive layer 161 on the metal wiring layer 120 on which the intrinsic layer 151 is formed, the second conductive layer 161 can be planarized such that the surface of the intrinsic layer 151 is exposed. Then, the second conductive layer 161 can be only present on the sidewalls and the bottom of the via hole 152. In another embodiment, blanket etching can be performed after forming the second conductive layer 161 such that the second conductive layer 161 remains only at sidewalls of the via hole 152.

Figure 7:
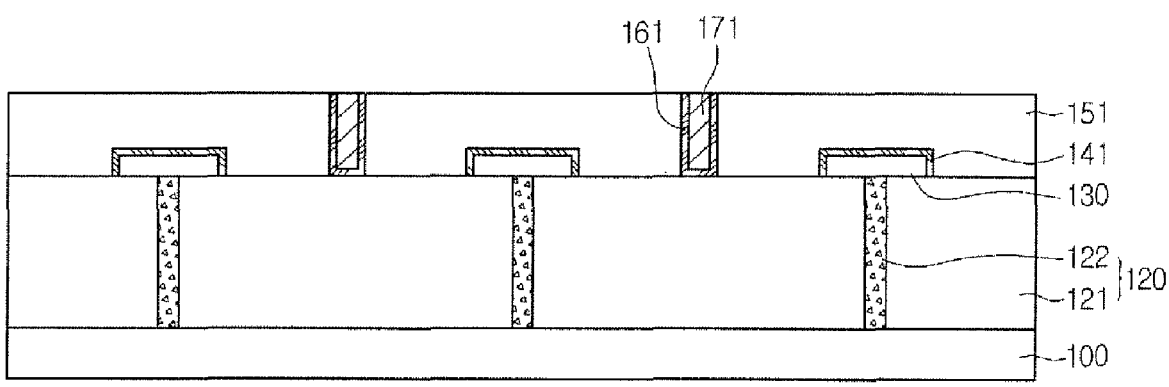

Referring to FIG. 7, pixel isolation layers 171 can be formed by filling metal material into the via hole 152 in the intrinsic layer 151 on which the second conductive layer 161 is formed.

In an embodiment, the pixel isolation layer 171 can be formed by depositing tungsten (or other metal) by CVD. In an alternative embodiment, the pixel isolation layer 171 can be formed by depositing tungsten (or other metal) by physical vapor deposition (PVD).

Accordingly, the metal material is deposited on the semiconductor substrate 100 including the second conductive layer 161 and the intrinsic layer 151 until the via hole 152 in the intrinsic layer 151 is completely filled. Subsequently, a planarization process can be performed to expose the surface of the intrinsic layer 151, such that the second conductive layer 161 and the pixel isolation layer 171 are formed in the inside of the via hole 152.

Figure 9:
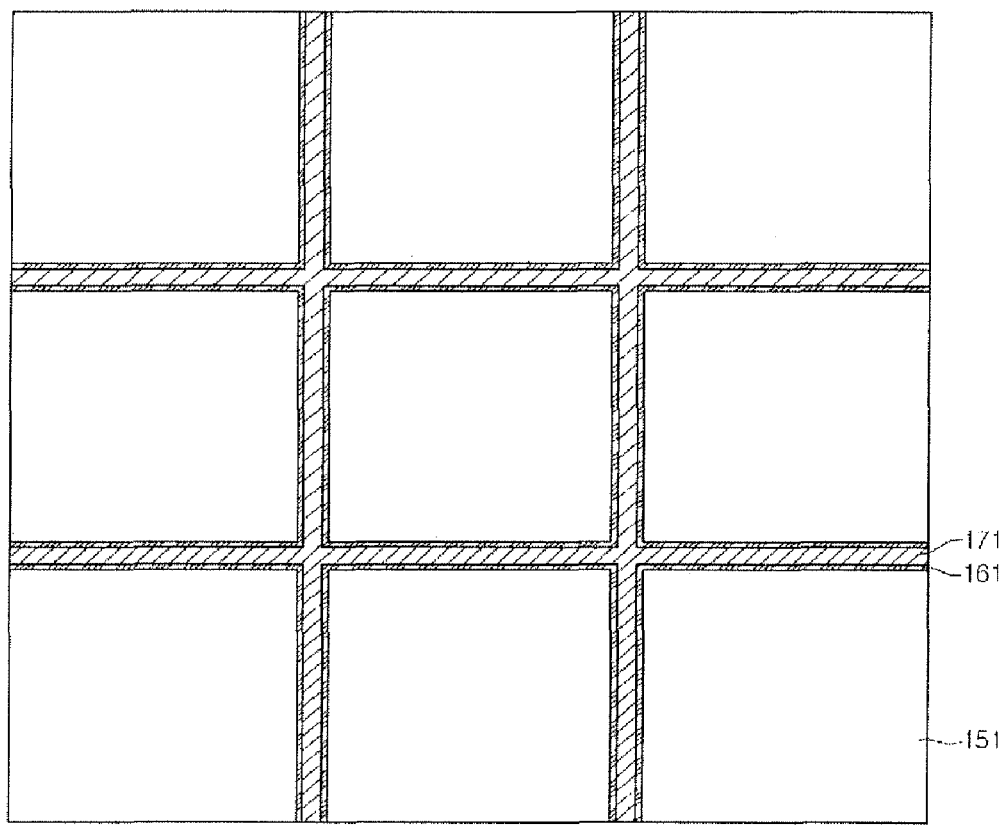
FIG. 9 is a plan view of an image sensor according to an embodiment of the present invention.

As shown in FIG. 9, the intrinsic layers 151 and the second conductive layers 161 are isolated into unit pixels by the pixel isolation layers 171.

The photodiodes comprising the first conductive layer 141, the intrinsic layer 151, and the second conductive layer 161 are separated into unit pixels by the pixel isolation layers 171.

Referring to FIG. 8, color filters 180 can be formed on the photodiodes.

In an embodiment, one color filter 180 is formed per unit pixel by exposing a color filter layer with a pattern mask and then developing it. Isolating color filters 180 into one per unit pixel helps inhibit incident light from adjacent pixels from striking the color filters 180. In many embodiments, the color filter 180 is formed to be spaced from neighboring color filters 180, thereby exposing the upper surface of the underlying pixel isolation layer 171.

In an embodiment, an upper electrode 190 is formed on the color filter 180. In an alternative embodiment, an upper electrode 190 is formed below the color filter 180. In a further alternative embodiment, no upper electrode is formed.

The upper electrode 190 can be formed of a transparent electrode having good light transmission and high conductivity. For example, the upper electrode 190 can be formed of an indium tin oxide (ITO) or a cadmium tin oxide (CTO).

In an embodiment, an upper electrode 190 is formed on the color filter 180 and fills up the space between color filters 180, thereby connecting the upper electrode 190 to the pixel isolation layer 171.

The image sensor and the method for fabricating the same according to the present invention can provide vertical-type integration of a transistor circuit and a photodiode.

In addition, the vertical-type integration of the transistor circuit and the photodiode allows for a fill factor of nearly 100%.

Furthermore, vertical-type integration makes it possible to provide a higher sensitivity image sensor in the same pixel size.

In addition, the unit pixels can implement a complex circuit without reducing the sensitivity.

Moreover, the vertical-type photodiode is adapted to provide an insulating property between the unit pixels so that crosstalk between the pixels is inhibited, thereby improving the reliability of the image sensor.

Another advantage of the image sensor and fabricating method of the present invention is that the second conductive layer 161 and the pixel isolation layer 171 function as a Schottky diode, thus inhibiting charge from flowing from a unit pixel to an adjacent pixel.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
   a semiconductor substrate having a circuit region formed therein;
   a metal wiring layer formed on the semiconductor substrate and comprising a plurality of metal wirings and an interlayer dielectric layer;
   a first conductive layer formed on the metal wiring layer electrically connected to a metal wiring of the plurality of metal wirings;
   intrinsic layer patterns formed on the metal wiring layer including the first conductive layer;
   a pixel isolation layer formed between the intrinsic layer patterns; and
   second conductive layers formed between the intrinsic layer patterns and the pixel isolation layer.

2. The image sensor according to claim 1, wherein the pixel isolation layer comprises a metal material.

3. The image sensor according to claim 1, further comprising at least one color filter formed on the intrinsic layer patterns.

4. The image sensor according to claim 3, further comprising a transparent electrode formed under the at least one color filter.

5. The image sensor according to claim 3, wherein adjacent color filters of the at least one color filter are spaced apart such that at least a portion of the pixel isolation layer is not covered by the at least one color filter.

6. The image sensor according to claim 5, further comprising a transparent electrode formed on the at least one color filter; wherein the transparent electrode is in contact with the pixel isolation layer.

7. The image sensor according to claim 1, further comprising an electrode formed on each metal wiring of the plurality of metal wirings.

8. The image sensor according to claim 7, wherein the first conductive layer is formed on the electrode.

9. The image sensor according to claim 1, wherein the first conductive layer comprises N-doped amorphous silicon, and wherein the intrinsic layer comprises amorphous silicon, and wherein the second conductive layer comprises P-doped amorphous silicon.

* * * * *